United States Patent [19]

Jerome et al.

[11] Patent Number: 5,139,966
[45] Date of Patent: Aug. 18, 1992

[54] LOW RESISTANCE SILICIDED SUBSTRATE CONTACT

[75] Inventors: Rick C. Jerome, Puyallup, Wash.; Frank Marazita, San Jose, Calif.

[73] Assignee: National Semiconductor Corporation

[21] Appl. No.: 503,344

[22] Filed: Apr. 2, 1990

[51] Int. Cl.⁵ .................................... H01L 21/225
[52] U.S. Cl. .................................. 437/162; 437/160; 437/31; 437/40
[58] Field of Search ............................ 437/160, 162

[56] References Cited

U.S. PATENT DOCUMENTS

| | | |
|---|---|---|
| 3,955,269 | 5/1976 | Magdo et al. . |
| 4,484,388 | 11/1984 | Iwasaki . |
| 4,507,847 | 4/1985 | Sullivan . |
| 4,536,945 | 8/1985 | Gray et al. . |
| 4,609,568 | 9/1986 | Koh et al. . |
| 4,764,480 | 8/1988 | Vora . |
| 4,795,722 | 1/1989 | Welch et al. . |
| 4,829,025 | 5/1989 | Iranmanesh . |
| 4,897,364 | 1/1990 | Nguyen . |

OTHER PUBLICATIONS

Brassington et al., "An Advanced Single-Level Polysilicon Submicrometer BiCMOS Technology", *IEEE Trans. Elect. Devices*, Apr. 1989.

Momose et al., "1μm n-Well CMOS/Bipolar Technology", *IEDM Transactions*, (Feb. 1985) p. 217.

Kapoor et al., "A High Speed High Density Single-Poly ECL Technology for Linear/Digital Applications" 1985 Custom Integrated Circuits Conference.

Gomi et al., "A Sub-30 psec Si Bipolar LSI Technology", *IEDM Technical Digest* (1988) pp. 744–747.

Takemura et al., "BSA Technology for Sub-100 mn Deep Base Bipolar Transistors", *IEDM Technical Digest* (1987), pp. 375–377.

Chiu et al., "A Bird's Beak Free Local Oxidation Technology Feasible to VSLI Circuits Fabrication", *IEEE Transactions on Electron Devices*, vol. ED-29, No. 4, pp. 536–540, Apr., 1982.

*Primary Examiner*—Brian E. Hearn
*Assistant Examiner*—Laura M. Holtzman
*Attorney, Agent, or Firm*—Irving S. Rappaport; Robert C. Colwell; Richard L. Hughes

[57] ABSTRACT

Low resistance contacts for establishing an electrical pathway to an integrated surface substrate are provided. The pathway is formed by the connection of a p+ doped channel stop region with a p+ doped extrinsic layer. P+ doped polysilicon contacts are positioned on the substrate surface. In one embodiment, a metal silicide layer connects the polysilicon contacts and overlies the p+ doped extrinsic layer.

16 Claims, 17 Drawing Sheets

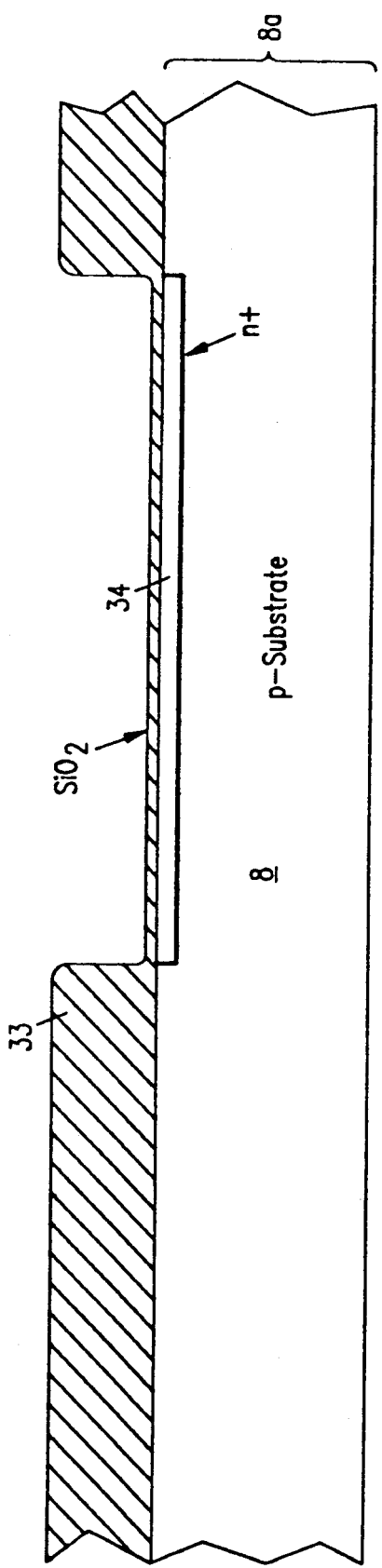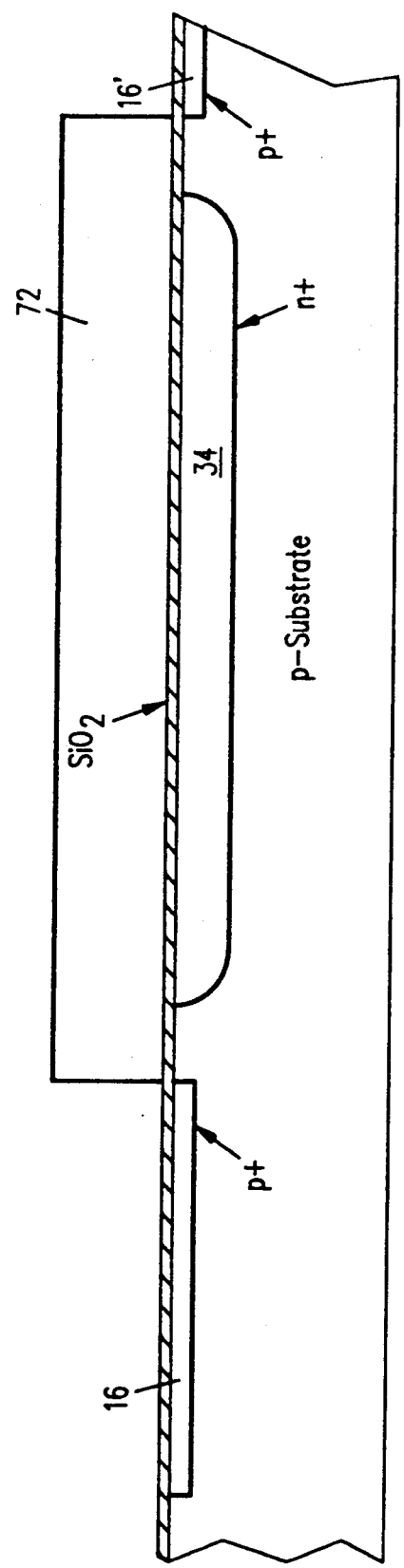

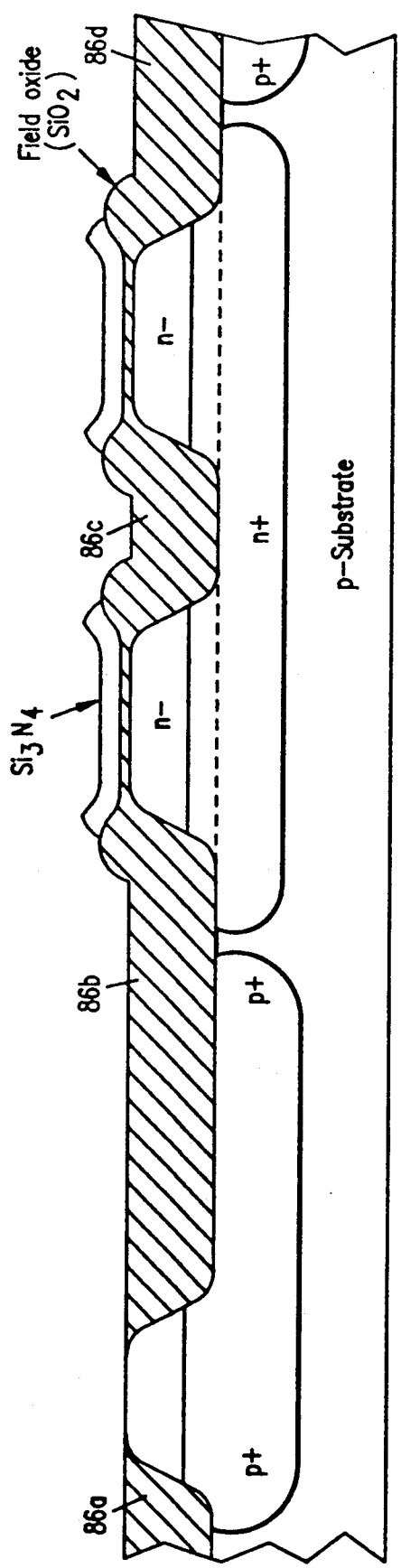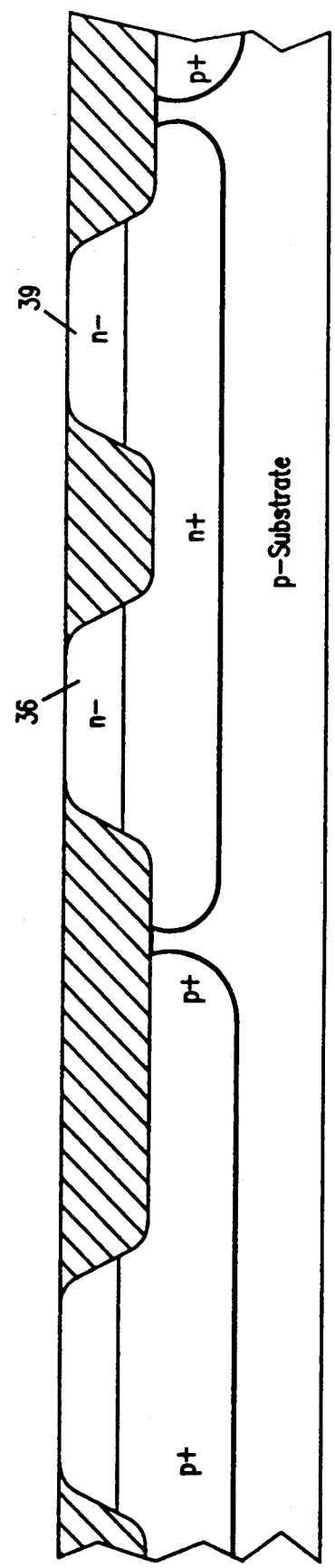

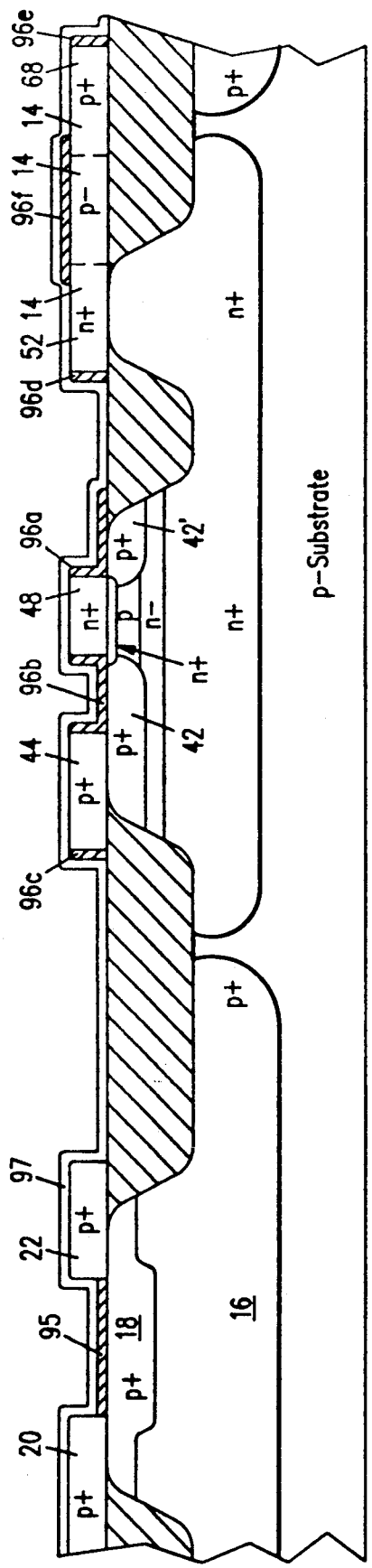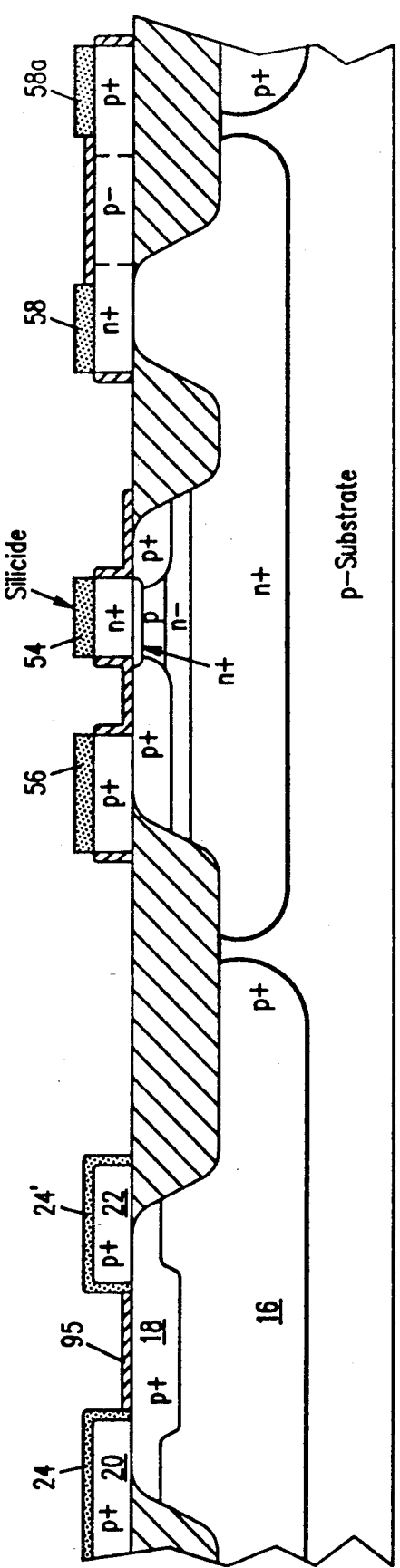
FIG. 2K
FIG. 2L

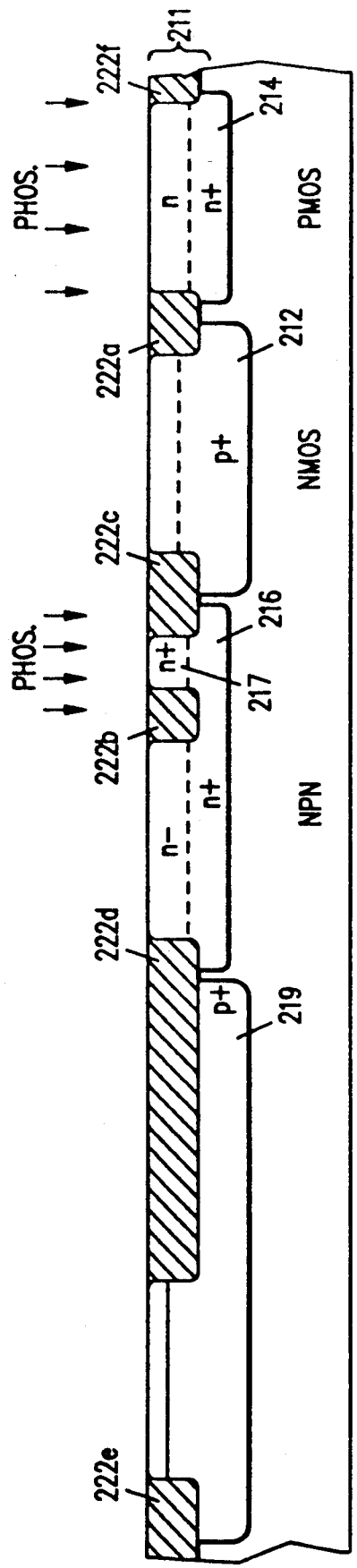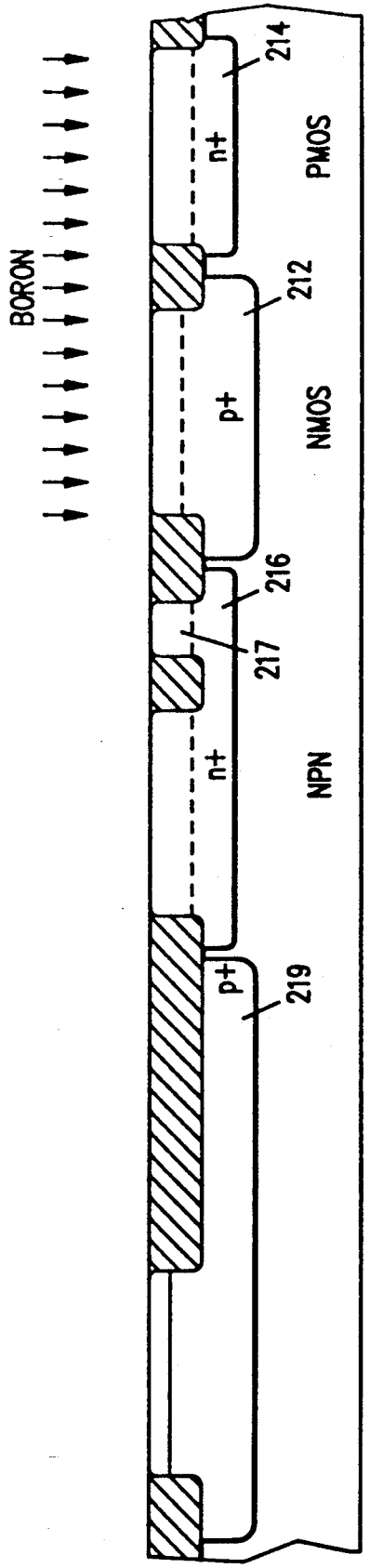
FIG. 4a
FIG. 4b

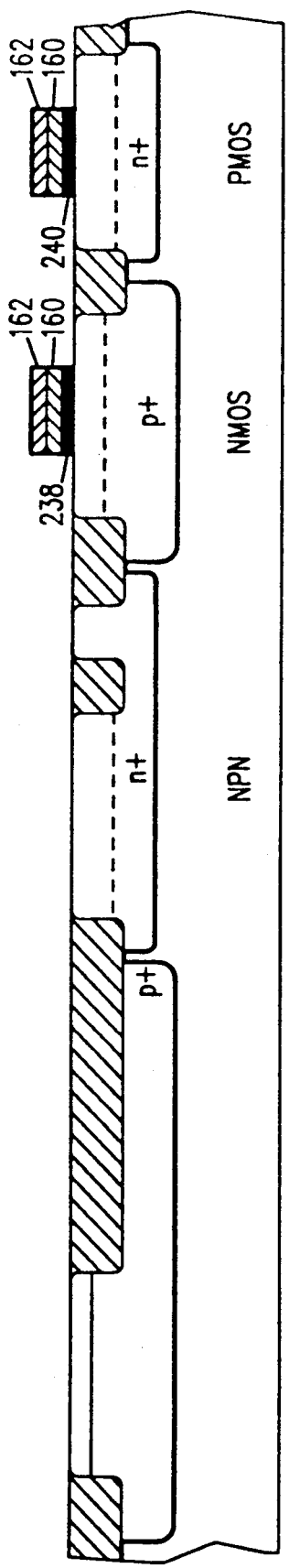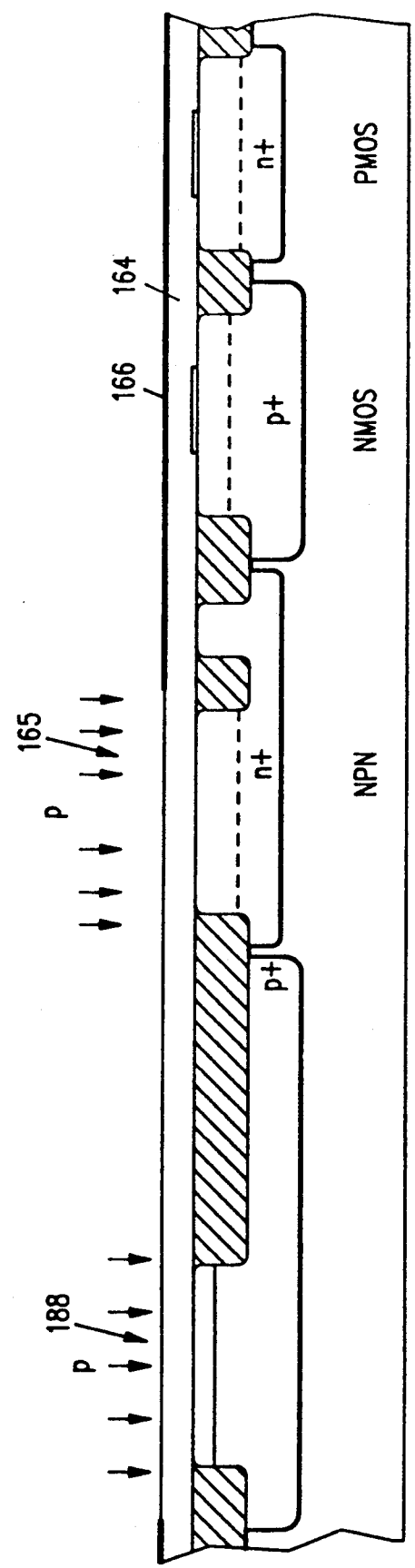

5,139,966

LOW RESISTANCE SILICIDED SUBSTRATE CONTACT

BACKGROUND OF THE INVENTION

The present invention relates to contacts for providing electrical connection to the substrate of an integrated circuit device and in particular to low resistance contacts including a metal silicide.

Integrated circuit devices formed on single crystal substrates typically require, for proper operation, that the substrate be maintained at a known constant electric potential. In order to provide for such constant electric potential, it is known to include one or more substrate contacts which provide an electrical pathway from an externally connectable pad or contact to the substrate. For many applications it is desirable that the electrical pathway have as low a resistance as possible. For example, programmable array logic devices typically require a low resistance pathway to the substrate since the process of programming the PAL injects a large quantity of current into the substrate. If this current is not removed quickly it can result in cross-talk which can prevent programming of adjacent devices in the array.

Although previous integrated circuit devices have included one or more substrate contacts, such contacts have typically been difficult to fabricate and/or have not as low an electrical resistance as desired.

SUMMARY OF THE INVENTION

The present invention provides for a low resistance electrical pathway to produce a substrate contact which can be easily and effectively formed using processing techniques and steps which are employed to produce other devices on a substrate such as transistor devices. According to one embodiment of the invention, a silicided layer is provided adjacent at least portions of the low resistance pathway.

BRIEF DESCRIPTION OF THE DRAWINGS

FIGS. 2a through 2m depict steps in a process for forming the substrate contact in the first embodiment of the present invention;

DETAILED DESCRIPTION OF THE PREFERRED EMBODIMENT

Figure 1:
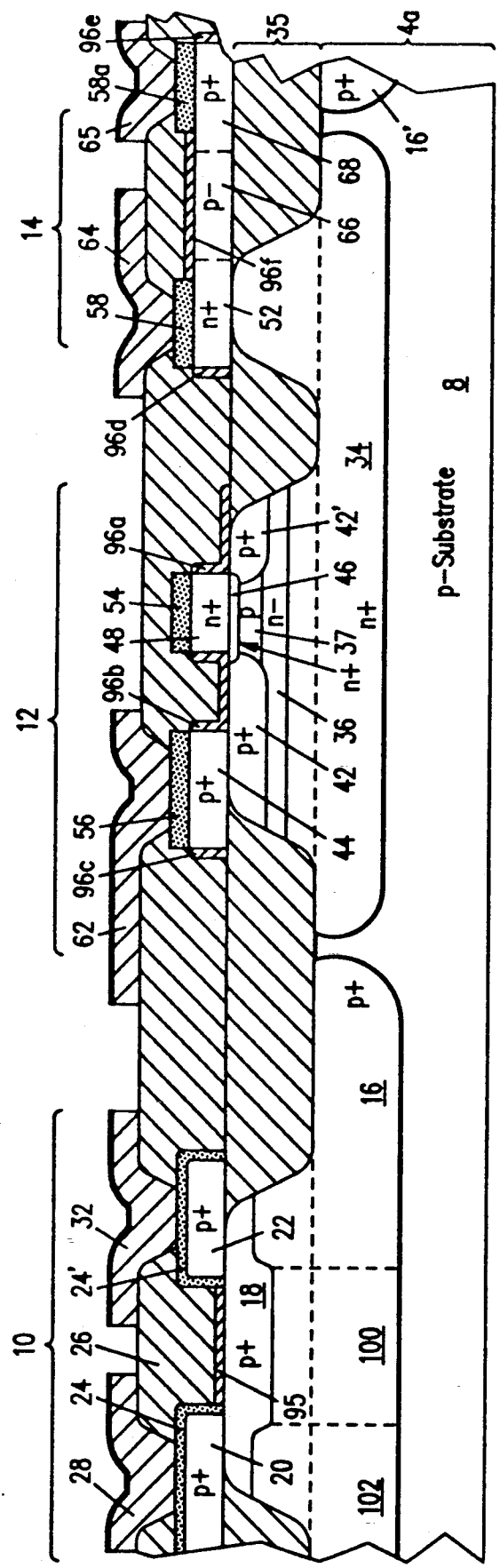
FIG. 1 depicts a silicided substrate contact formed according to a first embodiment of the present invention, adjacent to a bipolar device.

FIG. 1 depicts a substrate 8 on which is formed a substrate contact 10 according to a first embodiment of the present invention. The substrate 8 preferably includes a single-crystal body 8a and an epitaxial layer 35. Adjacent the substrate contact 10 is a bipolar transistor device 12 and a resistor 14. The substrate contact 10 includes p+ channel stops 16, 16' which are in contact with the p— substrate 8. One channel stop 16 resides beneath a p+ extrinsic region 18. Two p+ doped polysilicon regions 20, 22 are formed on the surface of the substrate. Layers of metal silicide 24, 24' are positioned over the polysilicon regions 20, 22. An oxide layer 95 is positioned above the p+ extrinsic region 18 between the two p+ doped polysilicon regions 20, 22. Contact oxide 26 is positioned above the substrate, polysilicon and silicide and has holes formed therein for accommodating metal contacts 28, 32.

The bipolar device 12 includes a buried layer 34 providing connection to an n— collector 36. Above the n-layer is a p doped base region 37. The base region 37 is connected, by p+ doped regions 42, 42' to a p+ doped polysilicon base contact 44. The p+ doped regions 42, 42' are connected, although the connection is not visible in the cross-section. An n+ doped emitter region 46 is in contact with an n+ doped polysilicon region 48 which overlies it. A second n+ doped polysilicon region 52 acts as the collector contact. Polysilicon regions 48, 44, and 52 are overlain by metal silicide layers 54, 56, 58. Metal contacts 62, 64 provide for electrical connection to the base and collector regions.

A first oxide layer 96a is formed adjacent to one of the sidewalls of the emitter contact 48 and extends therefrom a distance along the epitaxial silicon region, at least covering the p+ doped region 42'. A second oxide layer 96b forms sidewall spacers for both the emitter contact 48 and base contact 44 and extends along the epitaxial surface therebetween, covering a portion of the p+ doped region 42. A third oxide layer 96c forms another sidewall spacer for the base contact 44. An oxide layer 96d forms a sidewall spacer for the collector contact 52. An oxide layer 96e forms a sidewall spacer for the far end resistor contact 68. An oxide layer 96f covers a portion of the p— doped polysilicon region 66 to prevent siliciding of the upper surface thereof. An oxide layer 95 extends between the substrate contacts 20, 22, and separates the silicide regions 24, 2'.

The resistor 14 depicted in FIG. 1 is formed from a p— doped polysilicon region 66 which is adjacent a p+ doped polysilicon region 68 on one edge and the collector contact polysilicon region 52 on the other edge. The collector contact polysilicon region 52 acts as an end contact for the resistor 14. The far end resistor contact 68 is overlain by silicide 58a which is adjacent a metal contact 65. In other embodiments, different configurations can be used such as p— doped polysilicon resistors with p+ polysilicon ends.

Figure 2C:
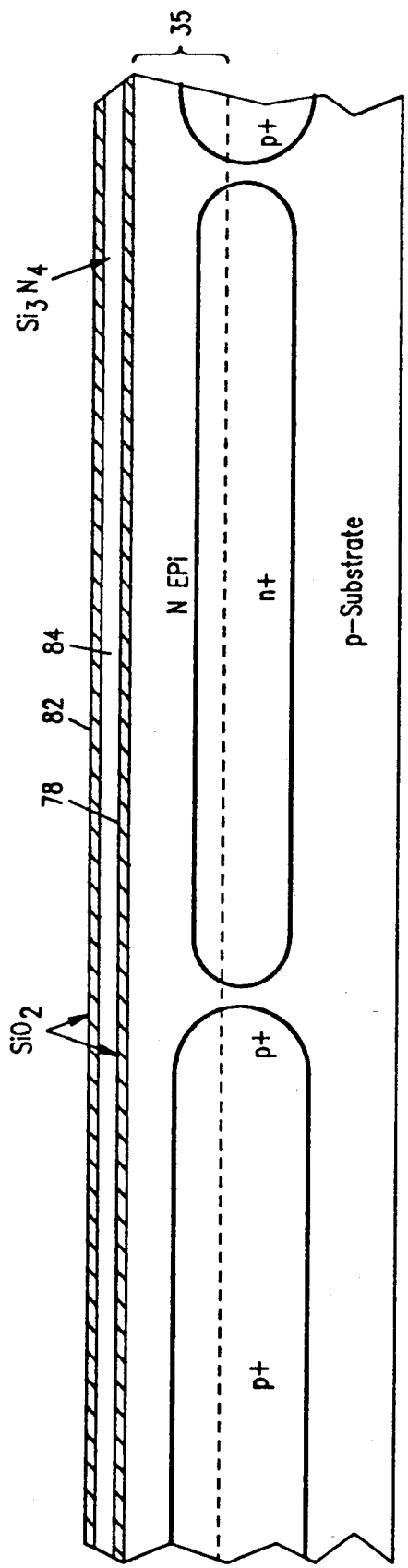
Figure 2D:
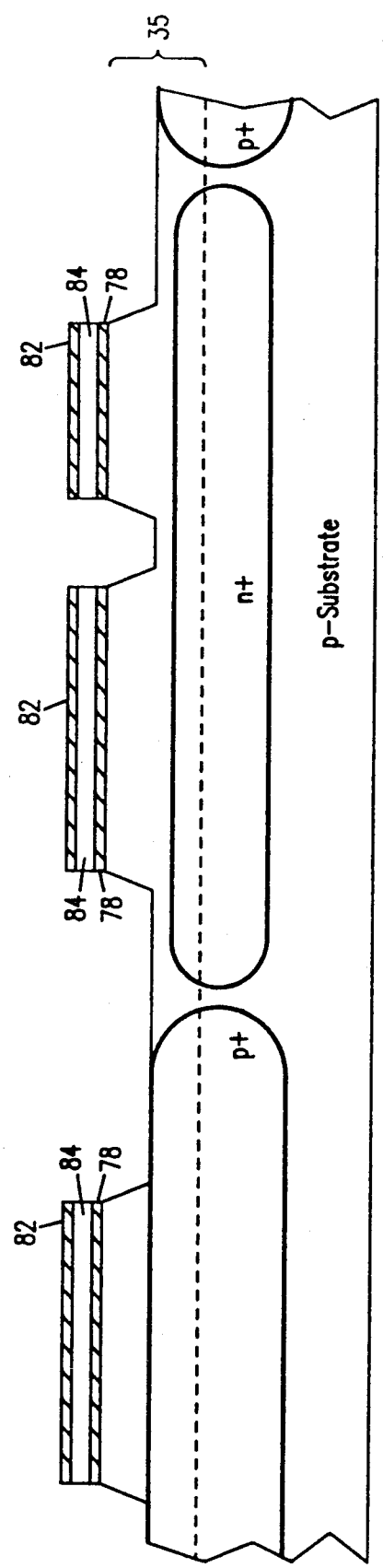
Figure 2G:
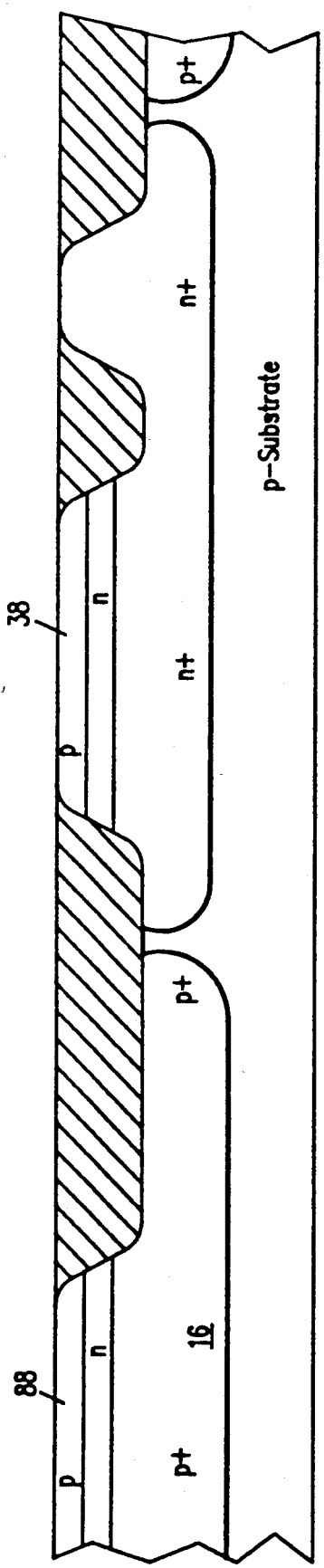

FIGS. 2a through 2m depict steps in the formation process of the substrate contact 10. The formation is described in the context of an overall process which also includes the formation of the bipolar device 12 and resistor 14. The substrate contact 10, however, can also be formed in connection with other types of devices on the same substrate including PMOS, NMOS, BiCMOS devices and the like as will be apparent to those skilled in the art. As shown in FIG. 2a, the p— single-crystal body 8a is initially oxidized and the oxide layer 33 is etched in order to expose regions which will receive an n+ implant that will be eventually become the buried layer 34. The buried layer 34 is implanted using arsenic, antimony or the like. The implant energy used is preferably about 40 to 100 KeV with a preferred range of between about 70 to 80 KeV such that the dopant concentration of region 34 is between about $1 \times 10^{19}$ and $1 \times 10^{20}$ with a preferred range of about $3 \times 10^{19}$ to $5 \times 10^{19}/cm^3$ at the surface prior to epitaxial silicon deposition.

The buried layer 34 is annealed, the oxide layer is stripped and a field implant resist mask 72 is formed (FIG. 2b) to protect the buried layer 34. Unprotected regions are subject to a field implant to produce p+ channel stop regions 16, 16'. The implant energy is preferably between about 40 and 100 KeV with a preferred range of 40 to 50 KeV such that the dopant concentration of the p+ layer is about $5 \times 10^{17}$ to $5 \times 10^{18}$ $cm^3$ at the surface, prior to epitaxial silicon deposition. The p+ regions preferably are doped with boron.

The field implant region is annealed by heating the substrate to a temperature of about 950° C. for about 60 minutes. The oxide layer is stripped and a doped epitaxial silicon layer 35 having a thickness of about 1.3 microns is grown across the surface of the single-crystal body 8a (FIG. 2c). Sandwiched layers of oxide 78, 82 and nitride ($Si_3N_4$) 84 are grown over the epitaxial layer 35. A photo resist mask (not shown) is then formed over the surface to define regions which will define field oxide regions. The areas to become field oxide regions are then etched leaving the structure depicted in FIG. 2d. Oxide regions 86A, 86B, 86C, 86D (FIG. 2e) are formed using a local oxidation of silicon (LOCOS)/Isoplanar process. The LOCOS process is described in U.S. Pat. No. 4,897,364, issued Jan. 30, 1990 to Nouvey, et al., incorporated herein by reference. The nitride is stripped and a planarization process produces the configuration depicted in FIG. 2f.

A grown screen oxide layer having a thickness of about 250 Å is formed on the surface of the substrate and a mask is formed exposing the sink region 39 and collector region 36. A sink implant using an implant energy of about 180 to 200 KeV with a dose of between about $1 \times 10^{19}$ and $2 \times 10^{15}$ using phosphorus as a dopant is performed. The resulting dopant concentration in the sink region 39 is between about $3 \times 10^{19}$ and $8 \times 10^{19}/cm^3$ at the silicon surface at the end of the process. The sink mask is then removed and a base implant is performed producing a p layer 38 (FIG. 2g) which is to become the bipolar base region. Simultaneously, a p layer 88 is formed above the p+ channel stop 16. The implant uses an energy between about 40 and 50 KeV with an implant energy of about 45 preferred. The dose of this $BF_2+$ implant is preferably about $3 \times 10^{13}/cm^2$.

Figure 2H:
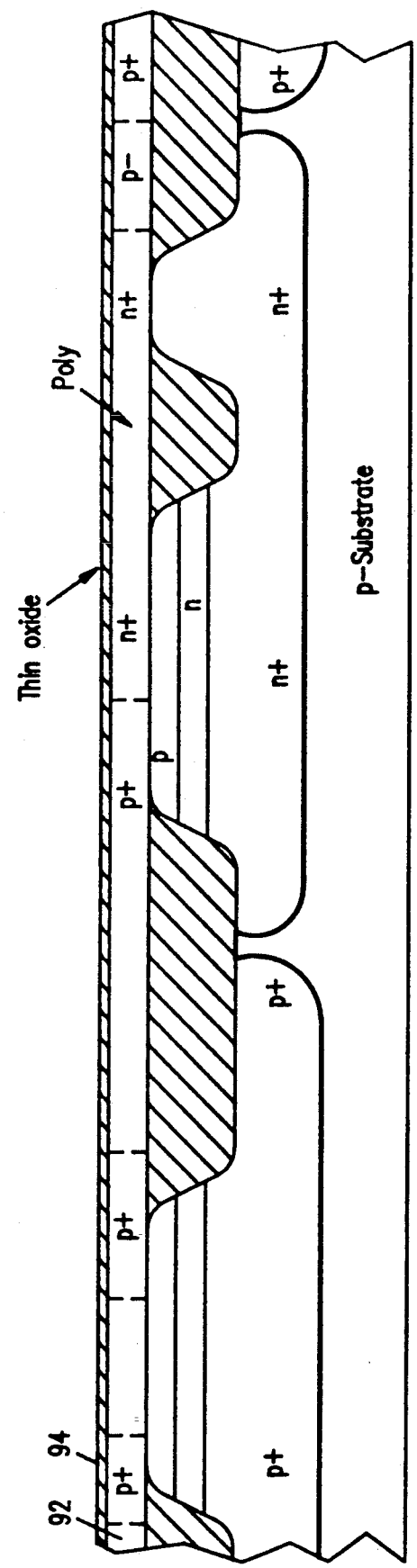
Figure 2I:
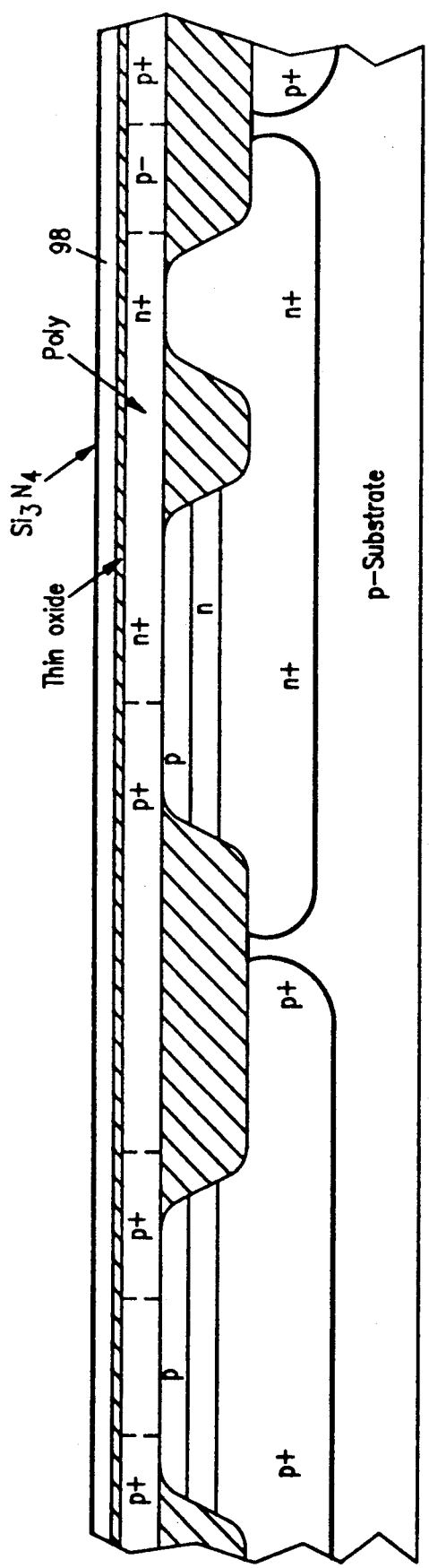
Figure 2J:
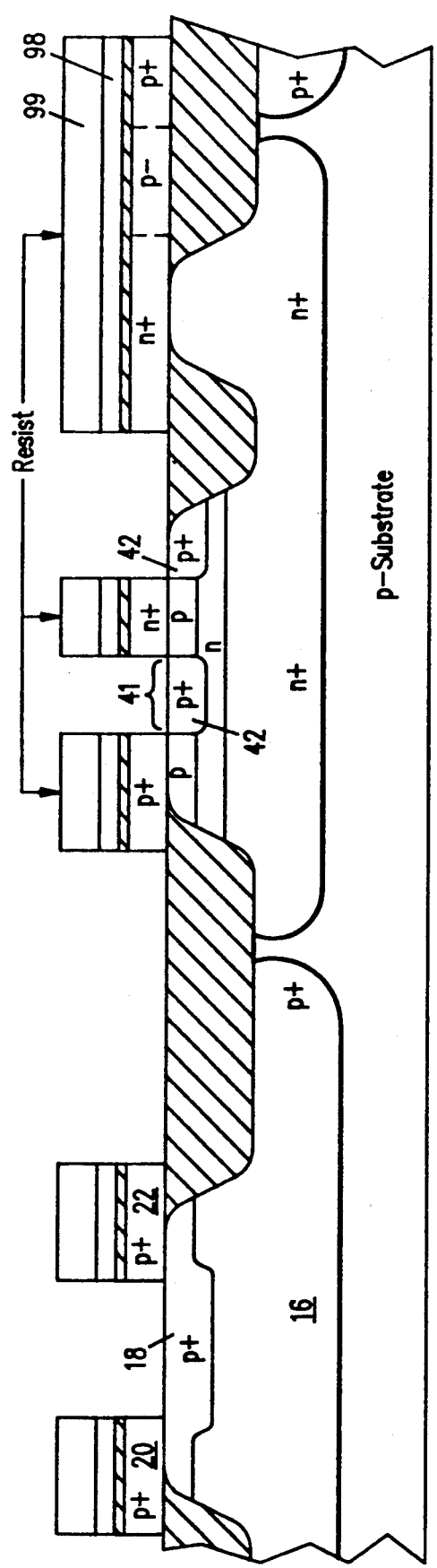

As depicted in FIG. 2h a layer of polysilicon 92 is deposited over the surface of the substrate and a capping oxide layer 94 is formed by thermal oxidation. Selected regions of the polysilicon layer 92 are masked implanted, to p−, n+, and p+ conductivity types to produce the configuration depicted in FIG. 2h. The p+ implant regions are doped using boron to a concentration of between about $1 \times 10^{18}$ and $1 \times 10^{19}/cm^3$ with a dopant concentration of about $5 \times 10^{18}/cm^3$ preferred. The p− implant region is doped using boron to a concentration preferably of about $3 \times 10^{18}$. The n+ doped regions are doped using an arsenic implant with an energy of about 100 KeV to a concentration of between about $1 \times 10^{19}$ and $1 \times 10^{20}/cm^3$. As depicted in FIG. 2i, a layer of nitride having a thickness of about 1100 Å is deposited to prevent etch undercutting of the underlying polysilicon. The polysilicon layer is then annealed at about 950° C. for a time of about 35 minutes.

A mask is formed on the surface of the nitride to protect the base, emitter, collector, and substrate contacts and the resistor. A nitride etch is performed followed by a polysilicon etch. The etch is conducted such that the epitaxial region 41 (FIG. 2g) adjacent to the bipolar base and between the substrate contacts are etched below the original epitaxial surface by about 1000 Å to 2000 Å. The etch mask is removed and a photo resist mask is formed to expose the extrinsic base region of the bipolar device and the region between the substrate contacts. A p type LDD using a dopant such as $BF_2$ is performed across the surface of the bipolar transistor and the substrate contact region. More heavily doped p regions are formed as a result. A p+ doped region 18 is positioned between the substrate contacts 20, 22. P+ doped regions 42 are self-aligned to the emitter and links in the base of the bipolar transistor. The resultant net dopant concentration in the regions 18, 42 is between about $5 \times 10^{18}$ and $1 \times 10^{19}/cm^3$. The implant energy is preferably between about 40 and 50 KeV, using $BF_2+$.

The resist 99 and nitride 98 are stripped. A final anneal is conducted by heating the substrate to about 950° C. for a time of about 35 minutes, with the first 15 minutes taking place in an $N_2$ atmosphere and the last 20 minutes taking place in a steam atmosphere. The final anneal forms an oxide layer on the exposed surface of the epitaxial layer and exposed upper surfaces and sidewall surfaces of the polysilicon regions. A mask is formed to protect the oxide spacers on the bipolar emitter 48, base 44, and collector 52 polysilicon contacts, the upper surface of a portion of the resistor 14, the exposed p+ doped epitaxial silicon regions 42, 42', and the area between the p+ doped polysilicon regions 20, 22. An etch is performed to remove the exposed oxide. As a result, sidewall spacers 96a–96d are left on the bipolar emitter 48, base 44, and collector 52 polysilicon contact regions and resistor end region 68, as depicted in FIG. 2k. An oxide layer 96f is left on the upper surface of a portion of the resistor 14. An oxide layer 95 is left on the surface of the epitaxial region in the area between the p+ doped poly regions 20, 22. The oxide layers 96a–96f, 95 define regions in which silicide will not be formed as described below. Additionally, the oxide layer 95 assists in further driving in the p+ implant 18 (during subsequent processing) to assist in forming contact between the p+ extrinsic region 18 with the channel stop 16, by means of the well-known oxidation-enhanced diffusion effect.

A layer of refractory metal such as titanium, molybdenum, tantalum, tungsten or the like 97 is deposited across the surface of the device as depicted in FIG. 2k. Using means well-known in the art, the layer heated to form metal silicide 24, 24', 54, 58, 58a in regions where the deposited metal is in contact with the polysilicon or epitaxial silicon. Remaining unreactive metal is etched away leaving the structure depicted in FIG. 2l. As seen in FIG. 2l, the silicide 24, 24' in the region of the substrate contact covers the upper surface and sidewalls of the polysilicon substrate contacts 20, 22. As discussed below, it has been found that the resistance in the region of the p+ doped extrinsic layer 18 with respect to the p− substrate is relatively low. The net result of the various thermal steps causing up diffusion from the p+ channel stop 16 and down diffusion from the p+ doped poly 20, 22 and p+ implant 18 is contact of the p+ extrinsic region 18 with the channel stop 16 to provide a low resistance pathway for substrate contact.

Figure 2M:
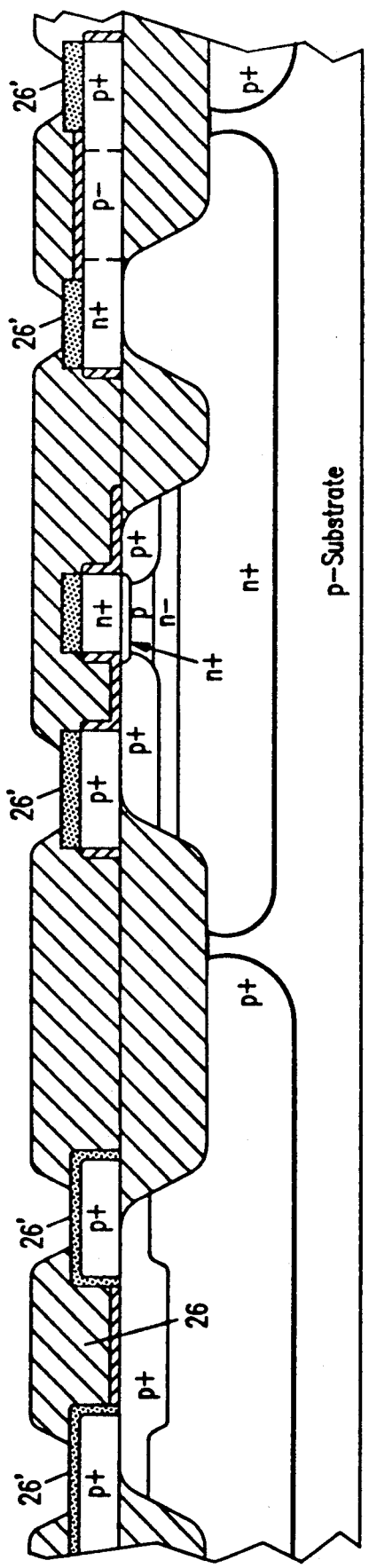

As depicted in FIG. 2m, an oxide layer 26 is deposited and masked to form contact holes 26' therein. Metal is deposited on the surface of the device, masked and etched from preselected regions, providing the device shown in FIG. 1.

Figure 3:
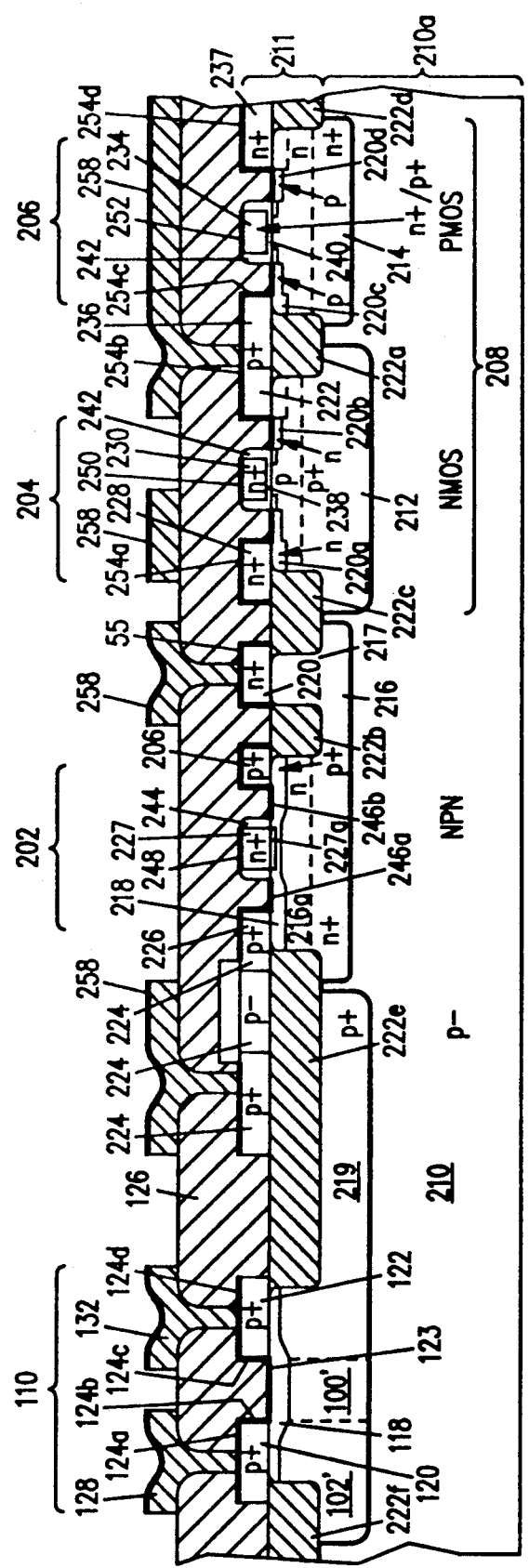
FIG. 3 depicts a silicided substrate contact formed according to a second embodiment of the present invention.

FIG. 3 illustrates a BiCMOS device in crosssection according to a second embodiment of the invention. In the embodiment shown in FIG. 1 the substrate 210 is a p− substrate having a dopant concentration of between about $1 \times 10^{13}$ and $1 \times 10^{15}$. On the substrate 210 is formed a substrate contact 110, according to the second embodiment of the present invention, adjacent a bipolar transistor 202 and an NMOS transistor 204 and a PMOS transistor 206. The NMOS transistor 204 and the PMOS transistor 206 are appropriately connected to form a CMOS structure 208. Preferably, the substrate 210 includes a single-crystal body 210a and an epitaxial layer 211. A resistor 224 is formed between the substrate contact 110 and the bipolar transistor 202. The substrate contact 110 includes a p+ channel stop 219 which is in contact with the p− substrate 210 and resides beneath a p+ extrinsic region 118. Two p+ doped polysilicon regions 120, 122 are formed on the surface of the substrate. A layer of metal silicide 124a, 124b, 124c, 124d is positioned over the upper surfaces and along the sidewalls of the polysilicon regions 120, 122. The sidewall silicide portions 124b, 124c are connected by a continuous portion 123 of silicide which overlies the extrinsic layer 118. Contact oxide 126 is positioned above the substrate, polysilicon and silicide and has holes formed therein for accommodating metal contacts 128, 132, 258.

In most embodiments the NMOS transistor 204 is formed in a p+ tub or well 212 and the PMOS transistor 206 is formed in an n+ tub or well 214. In preferred embodiments the n-well 214 is doped to a concentration of between about $1 \times 10^{16}$ and $1 \times 10^{17}$, and the p+ well 212 is doped to a concentration of between about $5 \times 10^{16}$ and $1 \times 10^{18}$, although a wide range of dopant concentrations may be used without departing from the scope of the invention. Well 212 and 214 enable the complementary conductivity devices to be formed on a single substrate.

The NPN transistor 202 is provided with a heavily doped buried layer 216 and collector sink 217, which together provide a low resistance connection region between a collector contact 220 and the collector 216a beneath p-type base 218. In preferred embodiments the buried layer 216 and sink 217 are doped to a concentration of between about $1 \times 10^{18}$ and $1 \times 10^{20}$. An emitter region 227a is diffused from the emitter contact 227 into the underlying epitaxial layer.

Between the NMOS transistor 204 and the PMOS transistor 206, between the sink 217 and the base 218, between the NPN and NMOS transistor, and between the transistors shown in FIG. 3 and adjacent transistors, oxide isolation regions 222a, 222b, 222c, 222d, 222e, and 222f respectively, are provided for device isolation which typically will be $SiO_2$. Viewed from the top of the structure, the oxide isolation regions connect to each other to form annular bands around the active device areas.

Along the surface of the device are doped polysilicon regions including a resistor 224, base contact 226, which also forms a p+ doped end contact for the resistor 224, emitter contact 227, n+ collector contact 220, NMOS source contact 228, NMOS gate 230, well tap/PMOS drain contact 232, 236, PMOS gate 234, and well tap 237. In preferred embodiments the NMOS gate 230 is formed of heavily doped n+ polysilicon, while the PMOS gate 234 is formed from n+ or p+ polysilicon, with n+ preferred because n+ will provide a buried channel device while p+ will provide a surface channel device. The described polysilicon regions, including the substrate contact regions 120, 122, are formed from a single layer of deposited polysilicon as described more fully below.

As seen in FIG. 3, thin gate oxide layers 238, 240 are provided beneath the NMOS and PMOS transistor gates, and sidewall oxide 242, 242' is provided on the sides of the NMOS and PMOS gates. Sidewall oxide 244 is also provided on the sidewalls of the bipolar emitter contact 227.

The major active components of the NPN device include an emitter 227a, a base region 218, and a collector region 216a. The major active portions of the NMOS device include a gate 230, a source 220a, and a drain 220b. The major active regions for the PMOS device include a gate 234, a source 220d, and a drain 220c.

Refractory metal silicide contacts 246a, 246b are formed on the upper surfaces and sidewall of the p+ bipolar transistor base contacts 226 and extend across the adjacent epi surfaces to the sidewall oxide 244. A separate silicide contact 248 is provided along the top portion of the emitter contact 227 between the sidewall spacer oxide regions 244. The refractory metal contacts shown herein reduce the resistivity of the base contact and, therefore, increase the speed of the device.

Similarly, silicide contacts are provided for collector contact 220, NMOS source contact 228, NMOS gate 230, p+ well tap 232, PMOS gate 234, and p+ drain contact 236. Like the contact for the emitter 227, the silicide contacts 250 and 252 for the NMOS and PMOS gates, respectively, extend only from sidewall oxide to sidewall oxide. Conversely, the silicide contacts 254a, 254b, 254c, and 254d for the source and drain contact of the NMOS and PMOS transistors also cover the sidewall of the polysilicon contacts and extend along the horizontal portion of the source/drain, in contact with the epitaxial silicon layer, up to the sidewall oxide of the gates 230 and 234. The silicide contact for the collector contact 220 covers the sidewalls of the contact down to field oxide regions 222b and 222c, as well as the upper surface of the collector. The structure further includes a thick (0.7 to 1.5 micron) oxide layer 126 to insulate the devices from metal connectors 128, 132, 258 used for interconnection purposes.

Figure 4E:
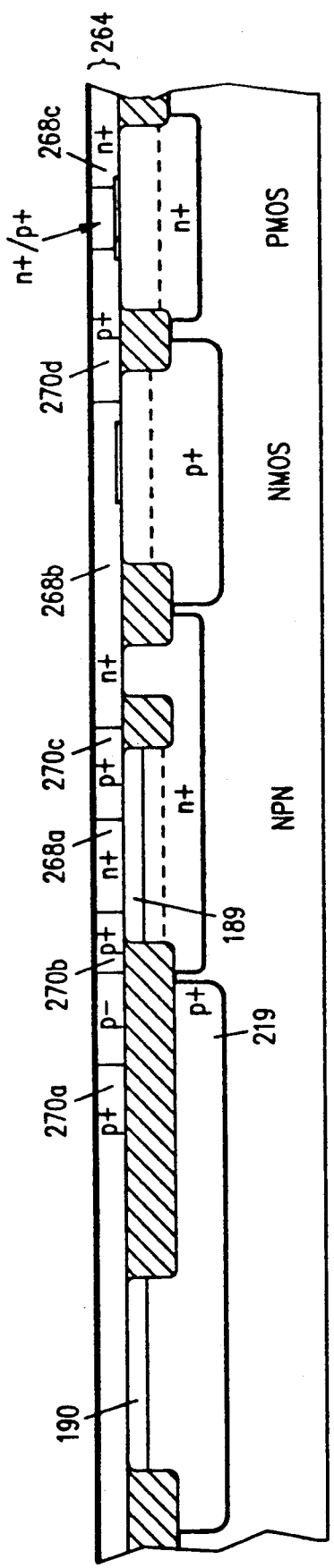
FIGS. 4a through 4n depict steps in a process for forming the substrate contact in the second embodiment of the present invention.
Figure 4F:
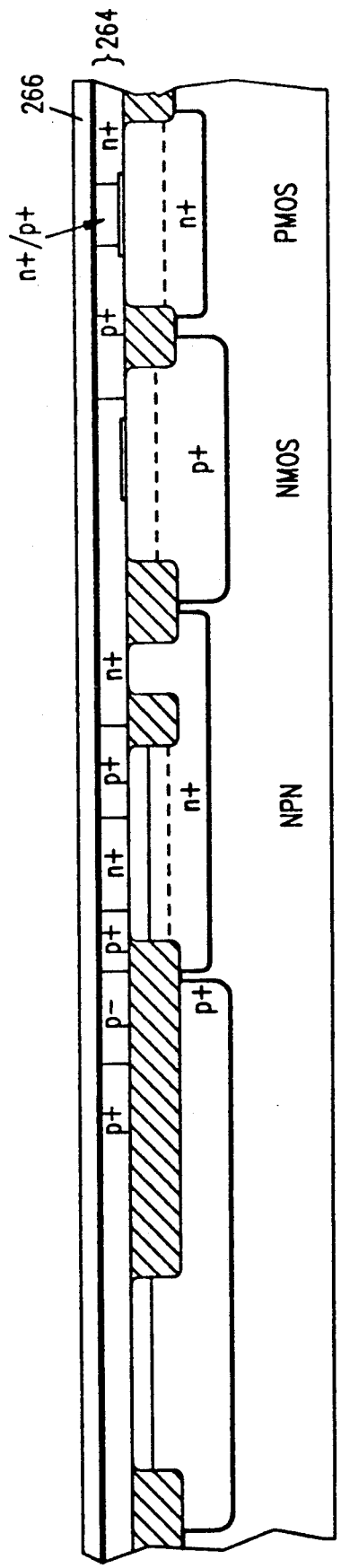
Figure 4G:
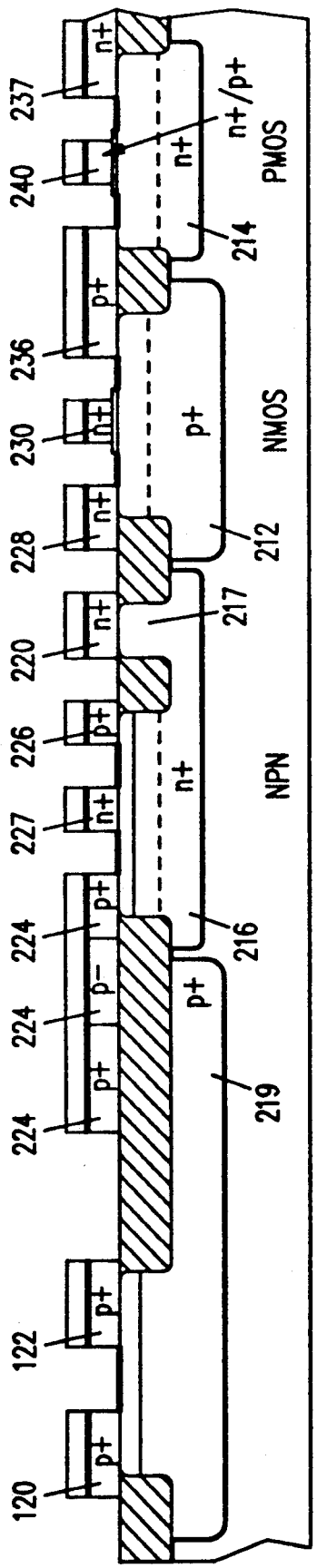
Figure 4H:
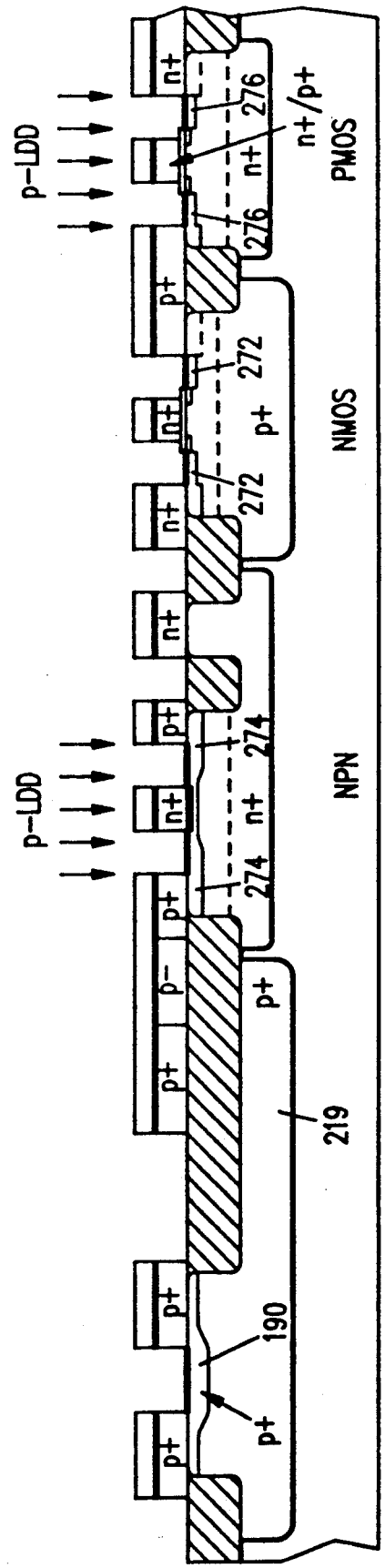
Figure 4I:
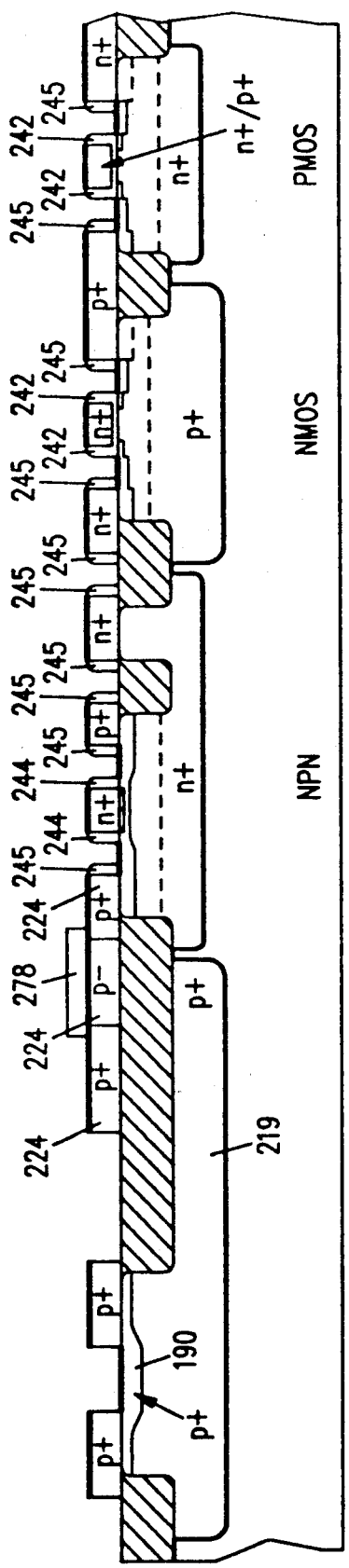
Figure 4J:
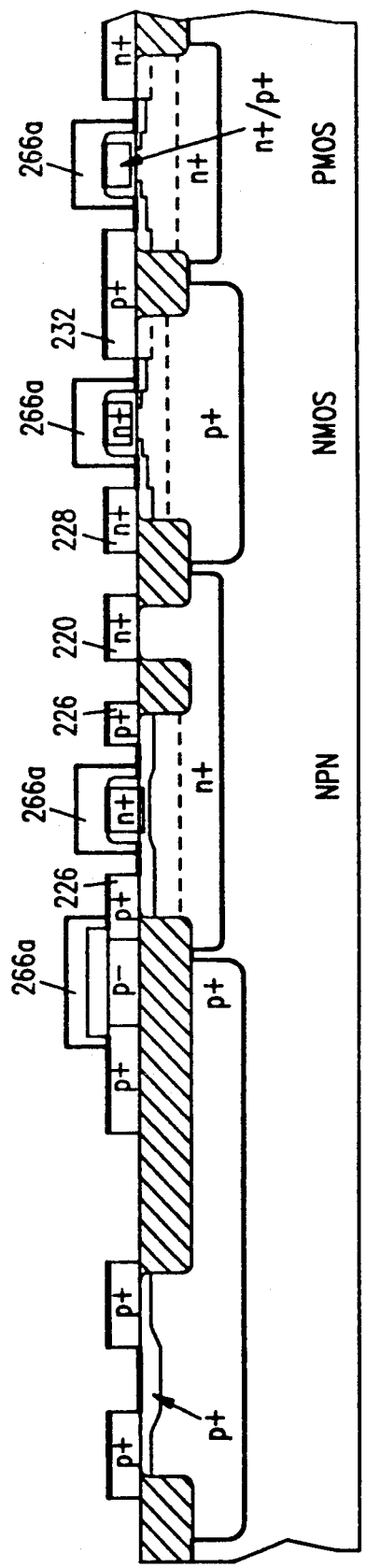
Figure 4K:
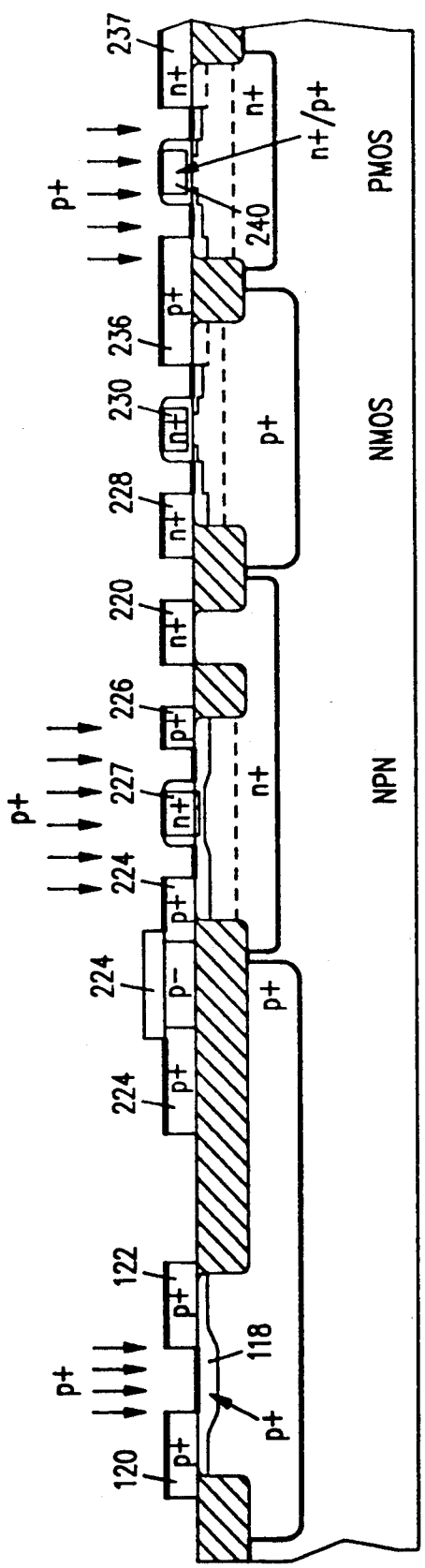
Figure 4L:
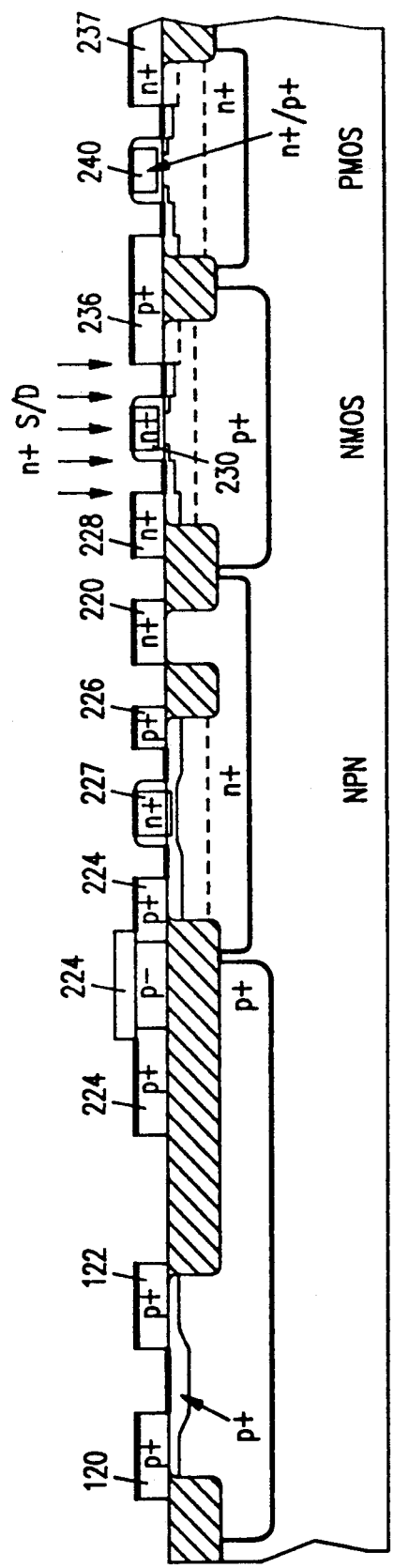
Figure 4M:
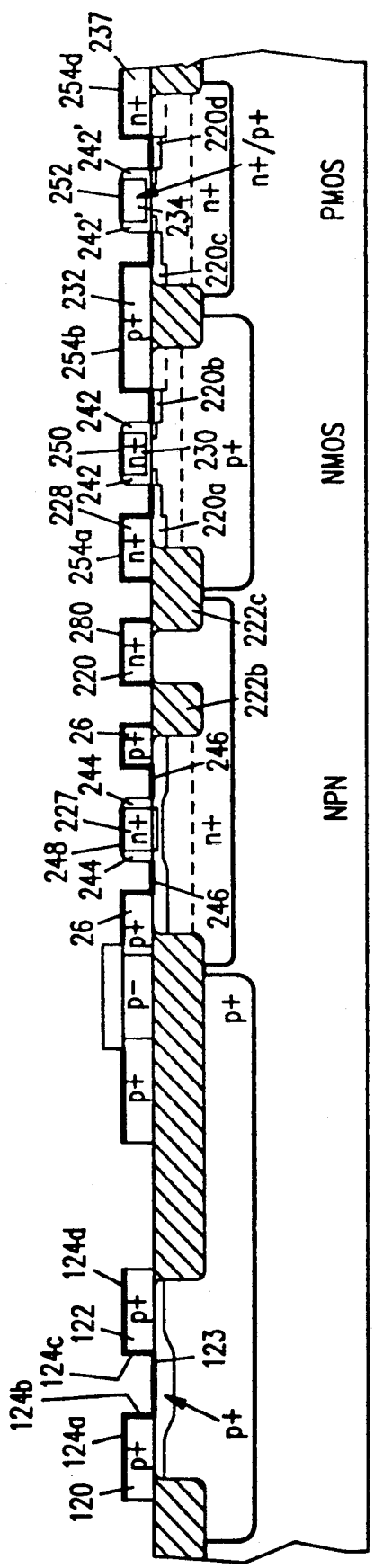
Figure 4N:
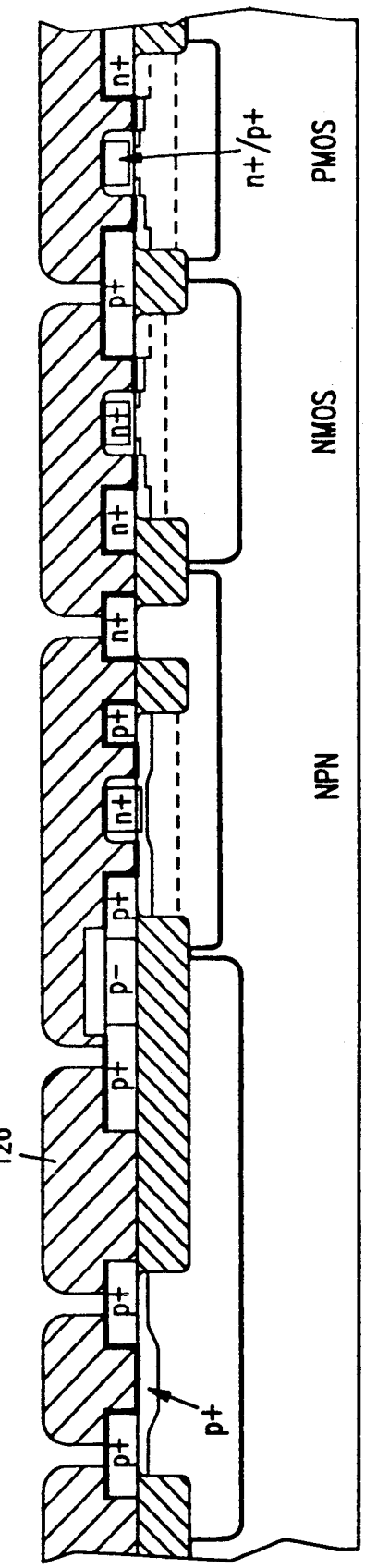

FIGS. 4a through 4n illustrate fabrication of the BiCMOS devices shown in FIG. 3. In particular, FIG. 4a illustrates a cross-section of the devices at a first stage of fabrication. To reach this stage, the single-crystal body 210a was masked for simultaneous formation of the n+ well 214 and the NPN buried layer 216 with arsenic, antimony, or the like. The implant energy used for formation of regions 214 and 216 is preferably between about 50 and 100 KeV such that the dopant concentration of regions 214 and 216 is between about $1 \times 10^{18}$ and $1 \times 10^{20}$.

After formation of the n+ regions 214 and 216, the device is then masked for simultaneous formation of the p+ channel stop 219 and the NMOS well 212. The implant energy used in formation of the regions 219 and 212 is preferably between about 100 and 180 KeV such that the dopant concentration of the p+ buried layers is between about $1 \times 10^{17}$ and $1 \times 10^{18}$. The p+ regions preferably are doped with boron.

The buried layer/channel stop mask is then removed and an intrinsic n-type epitaxial layer 211 having a thickness of about 1.1 microns is grown across the surface of the single-crystal body 210a. A photoresist mask is then formed over the device so as to define oxide regions 222a, 222b, 222c, 222d, 222e, and 222f. The oxide regions are formed using a modified sidewall masked isolation ("SWAMI") process. The SWAMI process is described, e.g., in Chin, et al., *IEEE Transactions on Electron Devices*, Vol ED-29, No. 4, Apr. 1982 pp 536-540. In some embodiments the process is modified as described in co-pending application Ser. No. 07/502,943, now abandoned, incorporated by reference.

Thereafter, a grown screen oxide layer having a thickness of about 250 Å is formed on the surface of the device and a mask is formed, exposing only the sink region 217. A sink implant using an implant energy of between about 100 and 180 KeV is preferred using 31 p+ as a dopant. The resulting dopant concentration in the sink region 217 is between about $1 \times 10^{18}$ and $1 \times 10^{20}$. The sink mask is then removed and a separate mask/ion implantation is performed to dope the well and channel regions of the PMOS transistor to a concentration of between about $1 \times 10^{16}$ and $1 \times 10^{17}$ using phosphorous as a dopant. In preferred embodiments the implant energy used for the PMOS well region is between about 50 and 180 KeV. The resulting net dopant concentration in the channel region of the n-well is between about $1 \times 10^{16}$ and $1 \times 10^{20}$. The sink and n-well are then annealed and driven-in by heating with a conventional thermal cycle in nitrogen.

Thereafter, a mask is formed on the surface of the device which exposes only the NMOS and PMOS transistor regions. This mask is used for a threshold voltage implant as shown in FIG. 4b. The implant may be used to adjust the threshold voltage of the NMOS and PMOS transistors, by setting the channel doping as necessary, typically to between about |0.5| and | 1.0 | volts. In preferred embodiments the threshold voltage implant is an implant of boron at a dose of between about $1 \times 10^{12}$ to $1 \times 10^{13}$ and an energy of between about 30 and 100 KeV. The threshold voltage implant sets the threshold of the NMOS transistors. The boron and the up-diffusing p+ from the buried layer will set the well profile for the NMOS transistor. The threshold voltage implant in conjunction with the n-well implant set the threshold voltage for the PMOS transistor. In preferred embodiments the threshold voltage implant ultimately provides transistors with threshold voltages of 0.7 to 0.9 volts for NMOS and $-0.8$ to $-1.0$ volts for PMOS.

The screen oxide then is stripped and a thin (on the order of 100 to 200 Å preferably 135 to 165 Å) gate oxide layer is grown using means well known to those of skill in the art. A thin (on the order of 100 to 1000Å, preferably 400 to 600 Å) layer of polysilicon 160 is then deposited on the thin gate oxide layer and a mask 162 is formed on the polysilicon layer to define the NMOS and PMOS gates (FIG. 4c). A plasma etch removes the undesired polysilicon from all regions of the device except those over the NMOS and PMOS gates. Next, a wet etch is used to remove the underlying oxide to provide the configuration depected in FIG. 4c. The mask is then removed by conventional techniques. Protection of the gate oxide 238, 240 provides MOS gates having fewer defects since they are not exposed directly to photoresist.

FIG. 4d illustrates the next sequence of process steps. Another layer of intrinsic polysilicon 164 having a thickness of about 3500 Å is deposited across the surface of the device and a cap oxide layer 166 is formed by thermal oxidation of the polysilicon layer 164. The devices are then masked with photoresist to expose at least the base region of the bipolar transistor, the substrate contact region, and the lightly doped regions of the resistors. In some embodiments, only the NMOS and PMOS transistor regions are protected by the mask.

A base implant is then performed in the bipolar base region 165 and in a region 188 overlying the region that will become the p+ channel stop 219, using $BF_2$, and the base is annealed. In preferred embodiments the base implant uses an energy of between about 30 and 100 KeV, preferably about 40 KeV. Before annealing, the polysilicon has a net dopant concentration of between about $1 \times 10^{17}$ and $1 \times 10^{19}$, and a portion of this dopant is diffused into the base region during the anneal. In preferred embodiments the anneal is performed by heating the structure to 900°-1000° C., preferably 950° C. for 20 to 60 minutes, preferably about 45 minutes, and results in p− base regions 189 and 190 (FIG. 4e) having a thickness of between about 1000 and 4000 with a dopant concentration of between about $1 \times 10^{14}$ and $1 \times 10^{19}$, with a dopant concentration of about $1 \times 10^{18}$ preferred.

Thereafter, as illustrated in FIG. 4e, a mask is formed which exposes regions 270a, 270b, 270c, and 270d which will eventually be a portion of the substrate contact, resistor, the base contacts, PMOS source-drain contacts, and the well tap contacts. The regions are preferably doped p+ to a concentration of between about $1 \times 10^{17}$ and $1 \times 10^{20}$ with a dopant concentration of about $1 \times 10^{19}$ preferred using boron. The p+ mask is removed and another mask is formed on the surface of the device to expose regions 268a, 268b, and 268c which will eventually be used as the bipolar emitter, the bipolar collector contact, the NMOS source-drain contacts, and the PMOS well tap contact. The regions 268 are doped n+ using an implant energy of about 100 KeV to a concentration of between about $1 \times 10^{18}$ and $1 \times 10^{20}$ with a dopant concentration of between about $1 \times 10^{19}$ and $1 \times 10^{20}$ preferred using arsenic. As discussed above, the PMOS gate may be either n+ or p+ and thus may be included in either the n+ or p+ mask.

In FIG. 4f, a layer of nitride 266 having a thickness of between about 1000 and 1500 Å is deposited for the purpose of preventing etch undercutting of the underlying polysilicon. The polysilicon layer 264 is then annealed at 850° to 950° C., preferably 920° C. for a time of about 30 minutes, or, using Rapid Thermal Anneal (RTA) at 1050° C. for about 20 seconds.

Next, a mask is formed on the surface of the nitride to protect the base, emitter, and collector of the bipolar transistor and the source, gate, and drains of the NMOS and PMOS transistors. A dry etch with chlorine or bromine chemistry results in the structure shown in FIG. 4g. The mask is then removed. A blanket lightly doped drain (LDD) implant is performed in which the source and the drain regions are lightly implanted with an n-type dopant such as phosphorous or arsenic using an implant energy of between about 20 and 100 KeV with implant energies of between about 20 and 50 preferred. This implant results in a net dopant concentration in the source and drain regions 272 of the NMOS transistor (FIG. 4h) of between about $1 \times 10^{17}$ and $1 \times 10^{19}$. In a similar fashion, as illustrated in FIG. 4h, a p-type LDD using a dopant such as $BF_2$ or B+ is performed across the surface of the bipolar transistor and the PMOS transistor with only the source and drain of the PMOS transistor and the extrinsic base region of the bipolar transistor exposed by a mask. A more heavily doped p-region 274 is formed in the extrinsic base of the bipolar transistor and a more heavily doped p-region 276 is formed around the gate of the PMOS transistor and the region 190 overlaying the p+ channel stop 219. The resulting net dopant concentration in the regions 190, 274 and 276 is between about $1 \times 10^{20}$, with about $1 \times 10^{19}$ preferred. The implant energy is preferably between about 10 and 50 KeV. When 11 B+ is used as the dopant, the lower range of implant energy is used.

A cap oxidation is performed to protect the heavily doped silicon regions during the nitride strip. As a result of the cap oxidation step, a thin (about 100 Å) layer of oxide is formed above the p+ doped region 190 overlying the p+ channel stop 219. Although the oxide layer is relatively thin, it does provide some oxidation-enhanced diffusion of boron to assist in providing a conductive pathway for the substrate contact. Nitride is then stripped from the surface of the device and a Low Temperature Oxide (LTO) deposition is performed. A silicide exclusion mask, not shown, is formed on the device on polysilicon regions where silicide formation is not desired (e.g., over the center portion of the resistor and on sidewalls). The oxide is then etched back, leaving oxide 278 over the resistor 224 and leaving spacer oxide 242, 244, 245 on exposed sides of the source contacts, drain contacts, gates, emitters, base contacts, and collector contacts as depicted in FIG. 4i, using means known to those of skill in the art. Another mask 266a (FIG. 4i) is then formed over the device for protection of at least the resistor oxide and the sidewall oxide on the bipolar emitter 244 and the gates 242 of the NMOS and PMOS transistors. The device is etched with BOE for about 80 seconds and, as shown in FIG. 4j, the oxide is removed from the sidewall 245 of the resistor/base contacts 226, the collector contacts 220, and the source and drain contacts 228, 232 of the NMOS and PMOS transistors.

Referring to FIG. 4k, a mask is formed and a heavy p+ ($BF_2$) implant is performed in the regions shown therein, i.e., in the region of the source/drain of the PMOS transistor and the extrinsic base region of the bipolar transistor and the substrate contact. The purpose of this implant is to lower the p+ source/drain and the base sheet resistances and contact resistances. The implant uses an energy of between about 20 and 100 KeV, with 40 KeV preferred. Similarly, as shown in FIG. 4l, an n+ (arsenic) implant is performed in the region of the source/drain of the NMOS transistor for the purpose of lowering n+ source/drain sheet resistance and contact resistance. The arsenic implant uses an energy of between about 50 and 150 KeV, with 100 KeV preferred. The device is then RTA annealed at a temperature of about 1000° to 1100° C. for about 10 to 20 seconds, preferably, at 1050° C. for 20 seconds.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon and silicon. Remaining unreacted metal is then etched away from the device, leaving a structure as shown in FIG. 4m. Preferably, the silicide reaction is conducted in two steps. The initially deposited titanium is reacted with adjacent polysilicon and silicon for a first period of time, as needed to form an initial amount of silicide that will adhere to the adjacent layers. In the first reaction, titanium does not react with $SiO_2$. Unreacted titanium, principally titanium in contact with any oxide, is removed, for example using $H_2O_2$ or $NH_3OH$. The device is again heated to cause a second silicide reaction to occur, completing the reaction between titanium and adjacent polysilicon and epitaxial silicon. The reaction is preferably conducted in two steps, as described, because reaction of titanium in a single step or pulse may cause undesirable reaction of titanium with the sidewall oxide layers.

As shown in FIG. 4m, the bipolar polysilicon base contacts 226 are covered with silicide 246 across their horizontal upper surfaces, and along their vertical sidewalls. In addition, the silicide contacts extend from the vertical sidewalls along the horizontal upper surface of the single-crystal base fully up to the sidewall oxide 244 of the emitter 227. The silicide contact 248 of the emitter extends across the horizontal upper surface of the emitter from one sidewall oxide to the opposite sidewall oxide. The silicide 280 on the collector contact 220 extends up both vertical sidewalls of the collector contact and fully across the horizontal upper surface of the contact, terminating on the field oxide regions 222b and 222c. The silicide 254a on the NMOS polysilicon source contact 228 extends from the field oxide region 222c, up the vertical sidewall of the contact, across its upper surface, and down the vertical portion of the contact to the source region 220a of the NMOS transistor. Additionally, the silicide extends from the source contact 228 across the horizontal upper portion of the NMOS source region 220a to the gate sidewall oxide 242. Like the bipolar emitter, the polysilicon gate of the NMOS transistor 230 includes silicide 250 across its upper surface which extends from one oxide sidewall to the opposite sidewall oxide. The polysilicon well tap 232 which has opposite doping from the source contact 232 also is covered with silicide 254b which covers both the vertical sidewall and horizontal upper surface of the well tap 232. The well tap silicide 254b extends across the surface of the NMOS drain 220b close to the NMOS gate 230 being separated therefrom by the gate sidewall 242. The well tap silicide 254b also extends across the surface of the PMOS drain 220c and the PMOS gate sidewall 242'. The PMOS gate 234 includes silicide 252 across its horizontal upper surface, while the PMOS source contact 237 includes silicide 254d across its upper horizontal surface and vertical sidewall extending across the PMOS source 220d, up to the PMOS gate sidewall oxide 242'. The p+ doped polysilicon layers adjacent the substrate contact 120, 122 include silicide on the horizontal upper surfaces 124a, 124d and sidewalls 124b, 124c. A layer of silicide 123 also extends along the surface of the epi joining the silicide 124b, 124c on the polysilicon regions 120, 124.

FIG. 4n illustrates the next step in the fabrication sequence in which an oxide layer 126, is deposited and masked to form contact holes therein. Metal is deposited on the surface of the device, masked and etched from selected regions, providing the device shown on FIG. 3.

DEVICE PERFORMANCE

Substrate vertical resistance simulations were conducted to calculate resistance in regions 100 and 102, depicted in FIG. 1, underlying, respectively the p+ extrinsic layer 18 and the p+ doped polysilicon contacts 20. The calculations yielded a simulated vertical resistance of about 7.0 Kohm per sq. micron in region 102. The simulated vertical resistance in region 100 was 3.0 Kohm per sq. micron.

Vertical resistance simulations were also conducted to calculate resistance in regions 100', 102' depicted in FIG. 3. The calculations yielded a simulated vertical resistance of about 15 Kohm per sq. micron in region 102'. The simulated vertical resistance in region 100' was about 8.6 Kohm per sq. micron.

Figure 5:
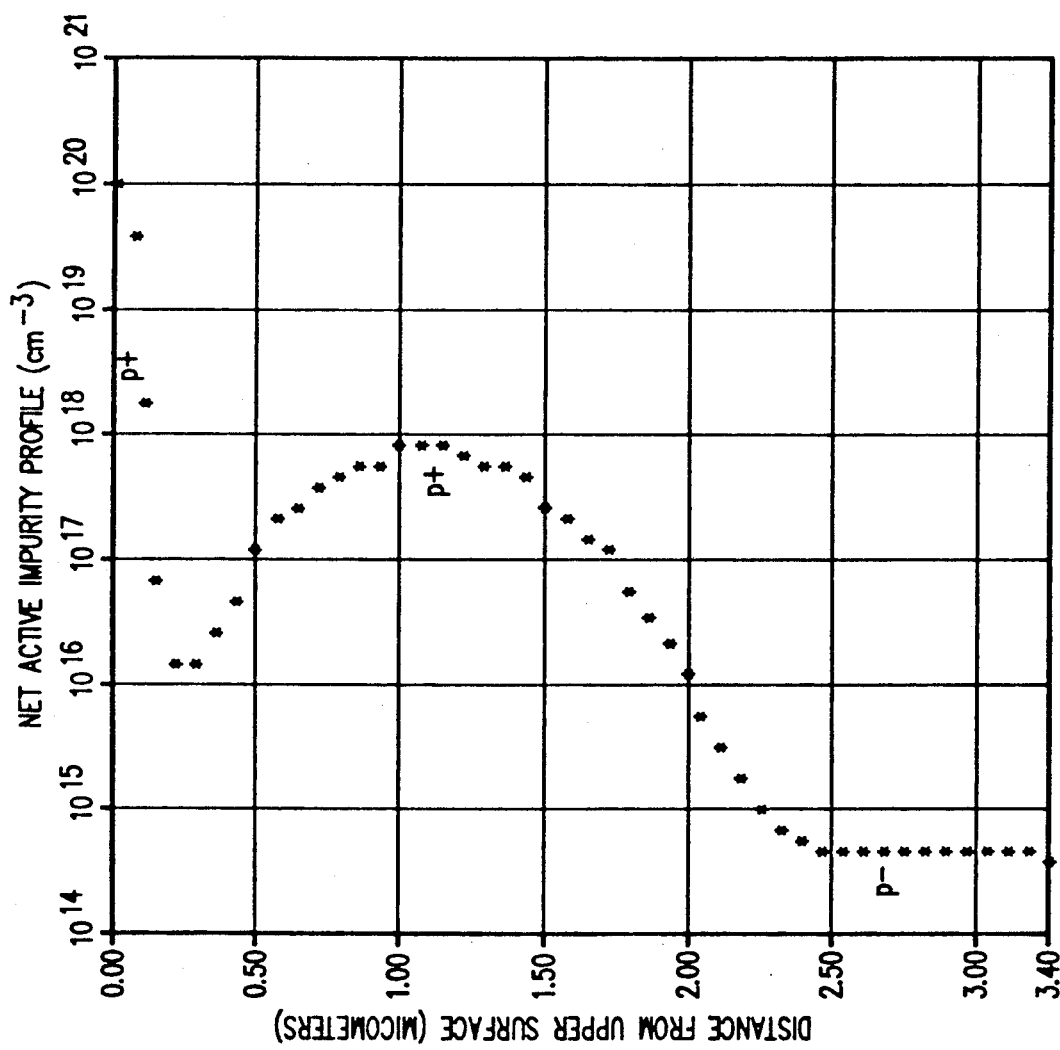
FIG. 5 depicts the depth profile of net active impurity in the substrate contact region of the device depicted in FIG. 3.

FIG. 5 depicts the profile of net active impurities in the central region 100' of the substrate contact of a device formed according to the process depicted in FIG. 4a through 4n, as a function of distance from the surface of the silicon. As seen in FIG. 5, moving from the extrinsic region 18 to the channel stop 16, the p+ concentration never falls below about $1 \times 10^{16}$, demonstrating the existence of a low resistance pathway for the substrate contact.

Figure 6:
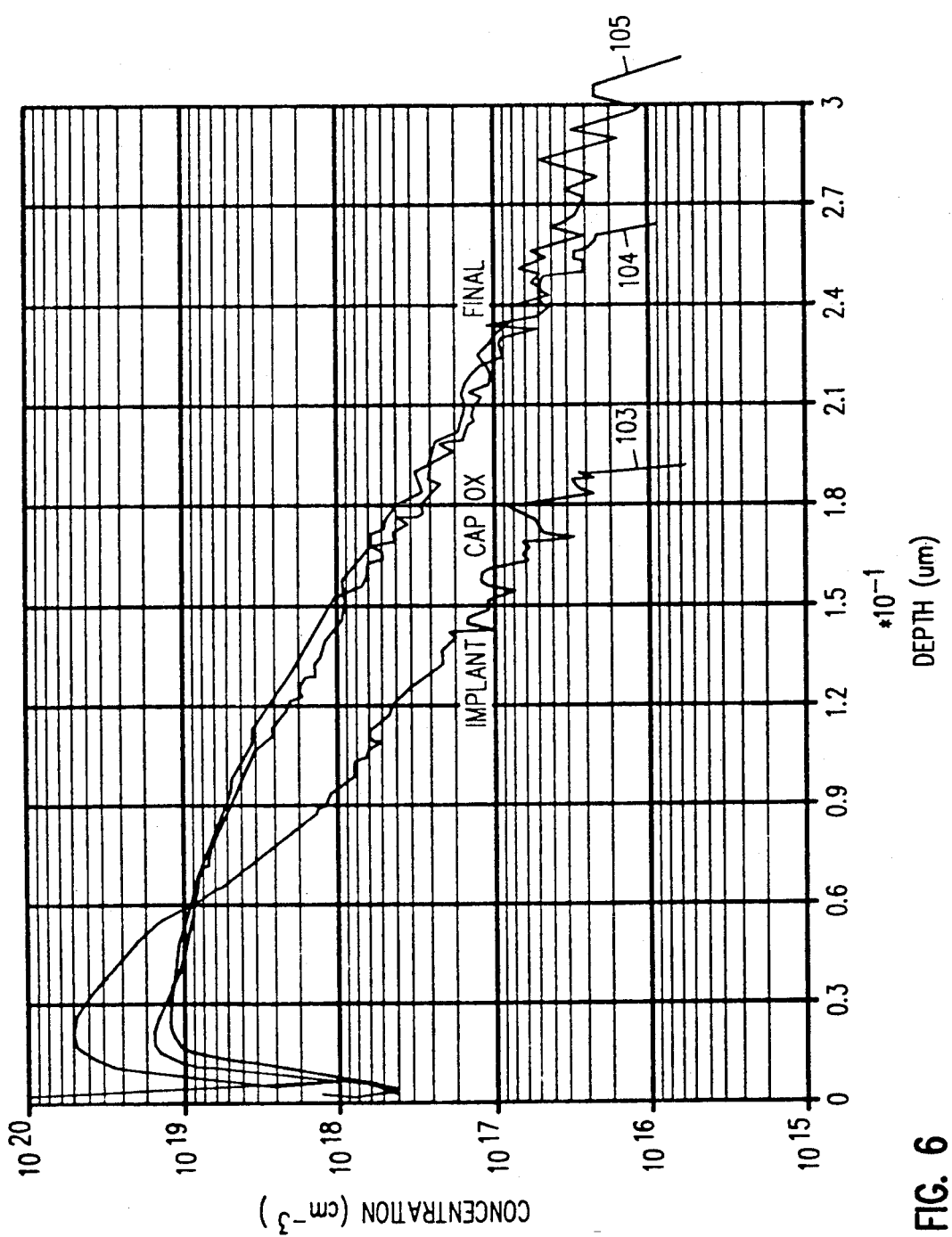
FIG. 6 depicts the depth profile of the extrinsic base implant and cap oxidation in the substrate contact region of the device depicted in FIG. 3.

FIG. 6 depicts measured p+ concentration as a function of depth (i.e., distance from the silicon upper surface) in the central region 100' substrate contact area of a device formed according to the process depicted in FIGS. 4a through 4n following the p+ implant step 103, the cap oxidation step 104, and the final anneal 105. FIG. 6 demonstrates that the low energy $BF_2$ implant will have a channelling tail tending to drive in the implant deeper and contributing to the low resistance pathway for the substrate contact. Such channelling tail is also believed to exist in a device formed according to the process depicted in FIGS. 2a through 2m.

It is to be understood that the above description is intended to be illustrative and not restrictive. Many variations of the invention will become apparent to those of skill in the art upon review of this disclosure. By way of example, particular regions of devices shown herein have been illustrated as being p type or n type, but it will be apparent to those of skill in the art that the role of n and p type dopants may readily be reversed. Further, while the invention has been illustrated with regard to specific dopant concentrations in some instances, it should also be clear the wide range of dopant concentrations may be used for many features of the devices herein without departing from the scope of the inventions. The scope of the invention should, therefore, be determined not with reference solely to the above-description, but instead should be determined with reference to the appended claims along with the full scope of equivalents.

What is claimed is:

1. A method of forming a substrate contact for an integrated circuit in order to provide an electrical pathway to the substrate with low resistance comprising:
    forming a first channel stop region in a substrate, both said substrate and said first channel stop region having a first conductivity type said first channel stop region being embedded in and in contact with said substrate;
    forming a first region of polysilicon on a first portion of the surface of said substrate, said first portion of said substrate overlying at least a portion of said first channel stop region, said first polysilicon region having said first conductivity type; said first polysilicon region being spaced from said channel stop region;
    annealing said substrate and said first polysilicon region, to provide diffusion from said first polysilicon region into said substrate to form a diffused region of said substrate, said diffused region forming at least a part of a substantially conductive path between said polysilicon region and said channel stop region.

2. A method, as claimed in claim 1, further comprising;
    implanting a doping material of said first conductivity type in said substrate to form a second doped region adjacent a second portion of the surface of said substrate, said second portion of the surface being adjacent said first portion of the surface.

3. A method, as claimed in claim 2, wherein said second region is spaced from said channel stop region by an undoped region of said substrate and wherein said step of implanting is performed before said step of annealing.

4. A method, as claimed in claim 2, further comprising:
    implanting a doping material of said first conductivity type in said substrate to form a source/drain region of a MOS device, wherein said step of implanting a doping material to form a source/drain region and said step of implanting a doping material to form said second doped region are conducted substantially simultaneously.

5. A method, as claimed in claim 2, further comprising:
    implanting a doping material of said first conductivity type in said substrate to form an extrinsic base region of a bipolar device, wherein said step of implanting a doping material to form an extrinsic base region and said step of implanting a doping material to form said second doped region are performed substantially simultaneously.

6. A method, as claimed in claim 1, wherein said first conductivity type is p type.

7. A method, as claimed in claim 1, wherein said step of forming said first region of polysilicon comprises forming a polysilicon region adjacent an exposed region of said surface of said substrate.

8. A method, as claimed in claim 7, further comprising;
    implanting said substrate adjacent said exposed region to form a third substrate region.

9. A method, as claimed in claim 7, further comprising:
    forming a continuous layer of substantially conductive material in contact with said first polysilicon region.

10. A method, as claimed in claim 9, wherein the surface of said exposed region is substantially free from said conductive material.

11. A method, as claimed in claim 9, wherein the surface of said exposed region is contacted by a layer of substantially conductive material.

12. A method, as claimed in claim 1, further comprising:
    forming a layer of substantially conductive material in contact with said first polysilicon region.

13. A method, as claimed in claim 12, wherein said step of forming a lyer of substantially conductive material comprises:

positioning a layer of refractory metal adjacent said first doped polysilicon region;

heating said substrate to form a layer of refractory metal silicide adjacent said first polysilicon region.

14. A method of forming a substrate contact for an integrated circuit formed on a substrate in order to provide an electrical pathway to the substrate with low resistance which includes an epitaxial region having a surface, said substrate being a p-conductivity type substrate, the method comprising:

implanting a p+ doping material in said substrate to form a channel stop region spaced from the surface of said substrate, said channel stop region being embedded in and in contact with the substrate;

implanting a doping material in said epitaxial region to form a p doped first epitaxial region, said first epitaxial region being adjacent the surface of said substrate, and said first epitaxial region being spaced from said channel stop region by an undoped epitaxial region;

forming a first p+ polysilicon region adjacent an exposed portion of said first epitaxial region, said first polysilicon region including an upper surface and at least a first sidewall; and annealing said substrate to provide diffusion from said first polysilicon region into said substrate to form a diffused region of said substrate, said diffused region forming at least a part of a substantially conductive path between said polysilicon region and said channel stop region, said first epitaxial region also forming at least a part of said substantially conductive path.

15. A method, as claimed in claim 14, further comprising;

positioning a layer of refractory metal contacting at least said upper surface and sidewall of said first polysilicon region;

heating said substrate, said first polysilicon region and said refractory metal to form a layer of refractory metal silicide adjacent at least said first polysilicon region.

16. A method, as claimed in claim 15, wherein said step of positioning a layer of refractory metal includes positioning refractory metal adjacent said p+ doped epitaxial region.

* * * * *